United States Patent
Xu et al.

(10) Patent No.: US 7,012,472 B2
(45) Date of Patent: Mar. 14, 2006

(54) DIGITAL CONTROL LOOP TO IMPROVE PHASE NOISE PERFORMANCE AND RX/TX LINEARITY

(75) Inventors: Zhiwei Xu, Los Angeles, CA (US); Yi-Cheng Wu, West Los Angeles, CA (US); Mau-Chung Frank Chang, Los Angeles, CA (US)

(73) Assignee: G-Plus, Inc., Santa Monica, CA (US)

( * ) Notice: Subject to any disclaimer, the term of this patent is extended or adjusted under 35 U.S.C. 154(b) by 0 days.

(21) Appl. No.: 10/888,861

(22) Filed: Jul. 9, 2004

(65) Prior Publication Data

US 2006/0006951 A1  Jan. 12, 2006

(51) Int. Cl.
*H03L 7/00* (2006.01)

(52) U.S. Cl. .......................... 331/16; 331/14

(58) Field of Classification Search ................. 331/14, 331/16, 17, 25, DIG. 2; 327/147, 156; 375/375, 375/376
See application file for complete search history.

(56) References Cited

U.S. PATENT DOCUMENTS 5,038,120 A * 8/1991 Wheatley et al. ............ 332/128
6,344,778 B1 * 2/2002 Nakamura et al. ............ 331/34

* cited by examiner

Primary Examiner—Linh My Nguyen
(74) Attorney, Agent, or Firm—DLA Piper Rudnick Gray Cary US LLP

(57) ABSTRACT

A system or method for controlling a voltage controlled oscillator (VCO) or LO buffer includes an amplitude detector for detecting an amplitude value at a node corresponding to the at least one output line. A comparator compares the detected amplitude value with a predetermined amplitude value, and outputs a first digital value when the detected amplitude value is greater than the predetermined amplitude value, and a second digital value when the detected amplitude value is less than the predetermined amplitude value. An accumulator accumulates outputs of the comparator so as to provide an accumulated digital amplitude value. A digital-to-analog converter converts the accumulated digital amplitude value to an accumulated analog amplitude value. The analog accumulated amplitude value is provided as an updated bias control signal to the bias transistor of the VCO or LO buffer.

23 Claims, 16 Drawing Sheets

(a) Up-Conversion in Transmitter Side (b) Down-Conversion in Receiver Side

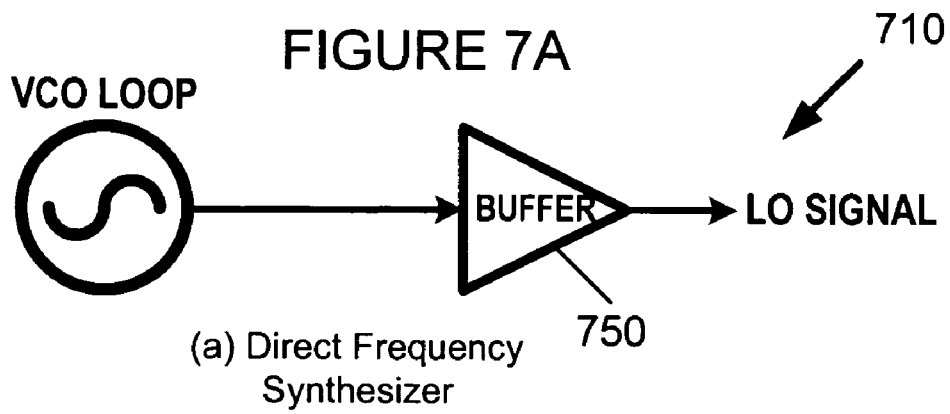
(a) Direct Frequency Synthesizer
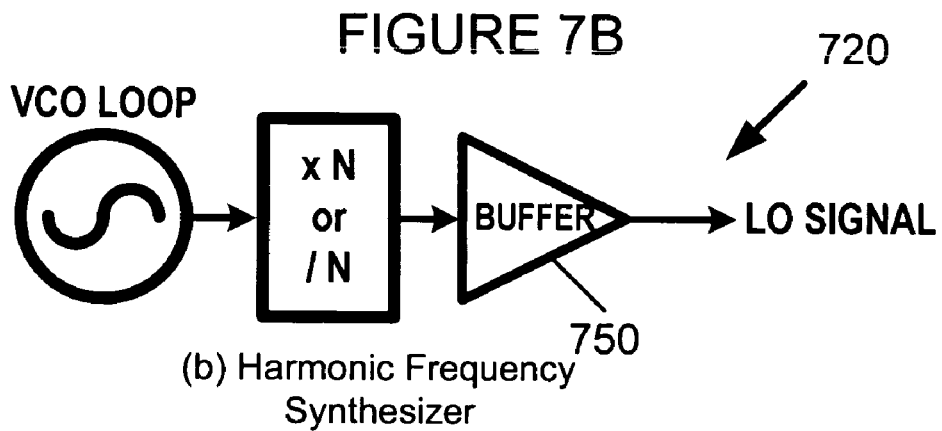
(b) Harmonic Frequency Synthesizer
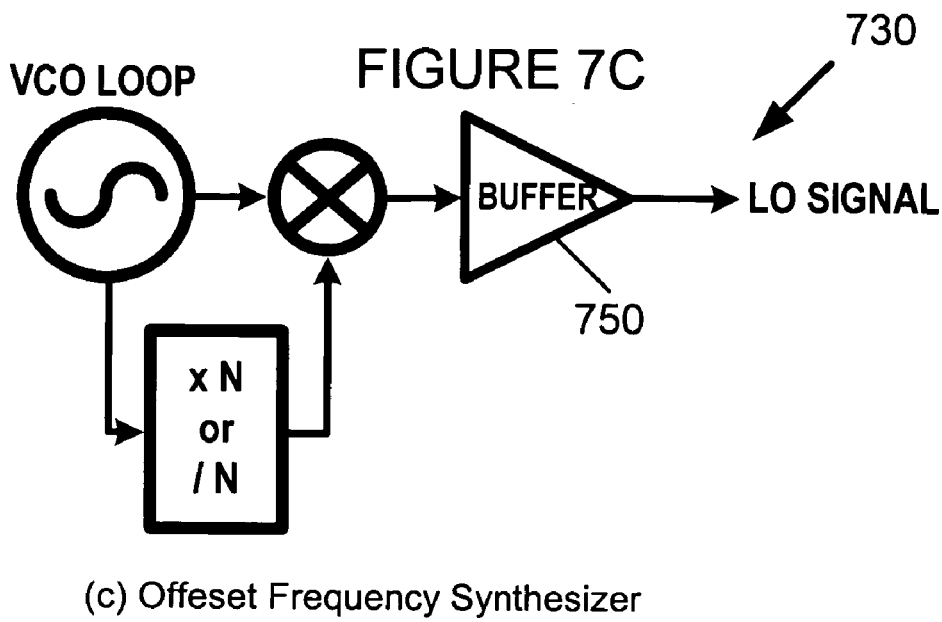
(c) Offeset Frequency Synthesizer

DIGITAL CONTROL LOOP TO IMPROVE PHASE NOISE PERFORMANCE AND RX/TX LINEARITY

BACKGROUND OF THE INVENTION

A. Field of the Invention

The present invention relates generally to the field of wireless communications. More particularly, the present invention relates to improving phase noise performance and receiver/transmitter linearity for a wireless communication system, by using a digital amplitude control loop or a digital voltage control loop.

B. Background

A frequency synthesizer is one of the key blocks in an RF transceiver chip, whereby the frequency synthesizer serves as a local oscillation signal generator. The frequency synthesizer is used to generate a high frequency RF signal by way of an up-conversion mixer in an RF transmitter portion of the RF transceiver chip, and by way of a down-conversion mixer in an RF receiver portion of the RF transceiver chip, thereby performing signal modulation and demodulation. As shown in FIG. 1A, a baseband signal is mixed with a local oscillation signal (LO) in a mixer 110 of an RF transmitter portion 100, whereby an RF signal is output from the mixer 110. This corresponds to up-conversion of a baseband signal to an RF signal. As shown in FIG. 1B, a received RF signal is mixed with an LO signal in a mixer 210 of an RF receiver portion 200, whereby a baseband signal is output from the mixer 210. This corresponds to down-conversion of an RF signal to a baseband signal.

To satisfy the requirement of high data bandwidth in an RF transceiver, such as 54 Mb/s in the 802.11 a/g standard, the phase noise requirement of LO signals become very tight. For example, to maintain a good Error Vector Magnitude (EVM) specification for 54 Mb/s mode in a wide area local area network (WLAN) system with a 3-dB implementation margin, the LO signal's integrated phase noise should be less than 1 degree.

Since there are typically many users in the same band in a wireless system, the interference between users become more serious in a crowded frequency band, which requires each different user sending less interference out of its channel, whereby this system is more immune to other interferences as well. There is accordingly a great demand for higher linearity performance for each single user. Besides designing a high linear mixer, the LO swing should also be optimized since it affects the linearity of the mixer as well.

Furthermore, with the dramatic increase in wireless communications recently, the chip power consumption budget becomes tighter, especially in a portable application. In an RF transceiver, the frequency synthesizer is one of the most power hungry circuits, whereby it burns approximately 40% of the total current consumed by the RF transceiver during receiving or transmitting. Thus, a low power frequency synthesizer is desired for an RF transceiver design.

SUMMARY OF THE INVENTION

One aspect of the present invention provides for a digital amplitude control system or method for an rf transceiver component.

Another aspect of the present invention provides for a digital voltage control system or method for an rf transceiver component.

According to at least one aspect of the invention, there is provided a system for controlling a voltage controlled oscillator (VCO), in which the VCO includes a bias transistor and at least one output line. The system includes an amplitude detector configured to detect an amplitude value at a node corresponding to the at least one output line. The system further includes a comparator configured to compare the detected amplitude value with a predetermined amplitude value, and to output a first digital value when the detected amplitude value is greater than the predetermined amplitude value, and a second digital value when the detected amplitude value is less than the predetermined amplitude value. The system still further includes an accumulator configured to accumulate outputs of the comparator so as to provide an accumulated digital amplitude value. The system also includes a digital-to-analog converter to converter the accumulated digital amplitude value to an accumulated analog amplitude value. The analog accumulated amplitude value is provided as an updated bias control signal to the bias transistor of the VCO.

According to another aspect of the invention, there is provided a method for controlling a voltage controlled oscillator (VCO), in which the VCO includes a bias transistor. The method includes detecting a voltage value at a node that is directly coupled to the bias transistor. The method further includes comparing the detected voltage value with a predetermined voltage value, and to output a first digital value when the detected voltage value is greater than the predetermined voltage value, and a second digital value when the detected voltage value is less than the predetermined voltage value. The method still further includes accumulating outputs of the comparing step so as to provide an accumulated digital voltage value. The method also includes converting the accumulated digital voltage value to an accumulated analog voltage value. The accumulated analog voltage value is provided as an updated bias control signal to the bias transistor of the VCO.

Other features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The foregoing advantages and features of the invention will become apparent upon reference to the following detailed description and the accompanying drawings, of which:

FIGS. 7A, 7B and 7C show different LO generation architectures for a frequency synthesizer;

DETAILED DESCRIPTION OF THE INVENTION

The present invention according to at least one embodiment is directed to an amplitude control system and method used for a frequency synthesizer, which can also be used to regulate the amplitude of several key blocks of the frequency synthesizer, such as a voltage control oscillator (VCO) and an LO driver. By using an amplitude control technique, the frequency synthesizer's performance can be optimized to thereby avoid extra power. This makes the design trade off between chip performance and power consumption easier to deal with.

The present invention according to another embodiment is directed to a voltage control system and method used for a frequency synthesizer, which can be used to regulate the voltage of several key blocks of the frequency synthesizer.

The present invention according to other embodiments is directed to a digital voltage control or amplitude control system and method for improving phase noise performance for a local oscillator (LO) or an LO buffer.

Figure 1A:
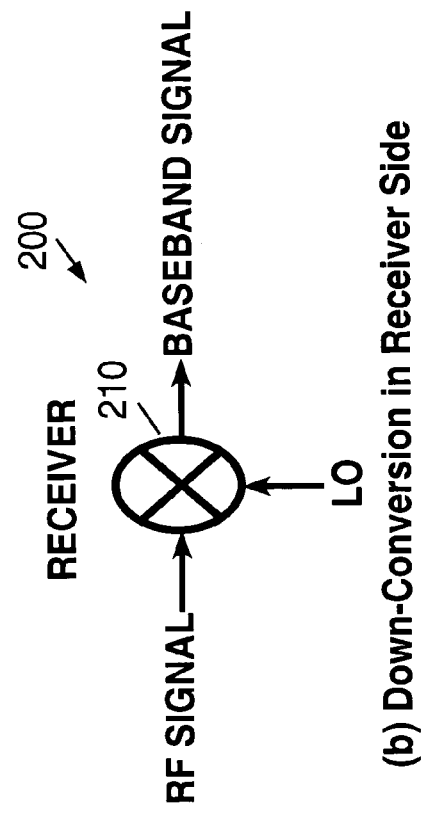
FIGS. 1A and 1B show signal modulation and demodulation in a conventional RF Transmitter and Receiver, respectively.
Figure 1B:
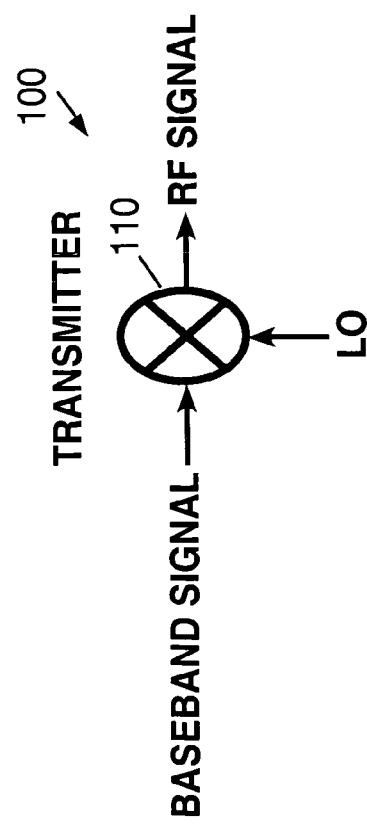
Figure 2:
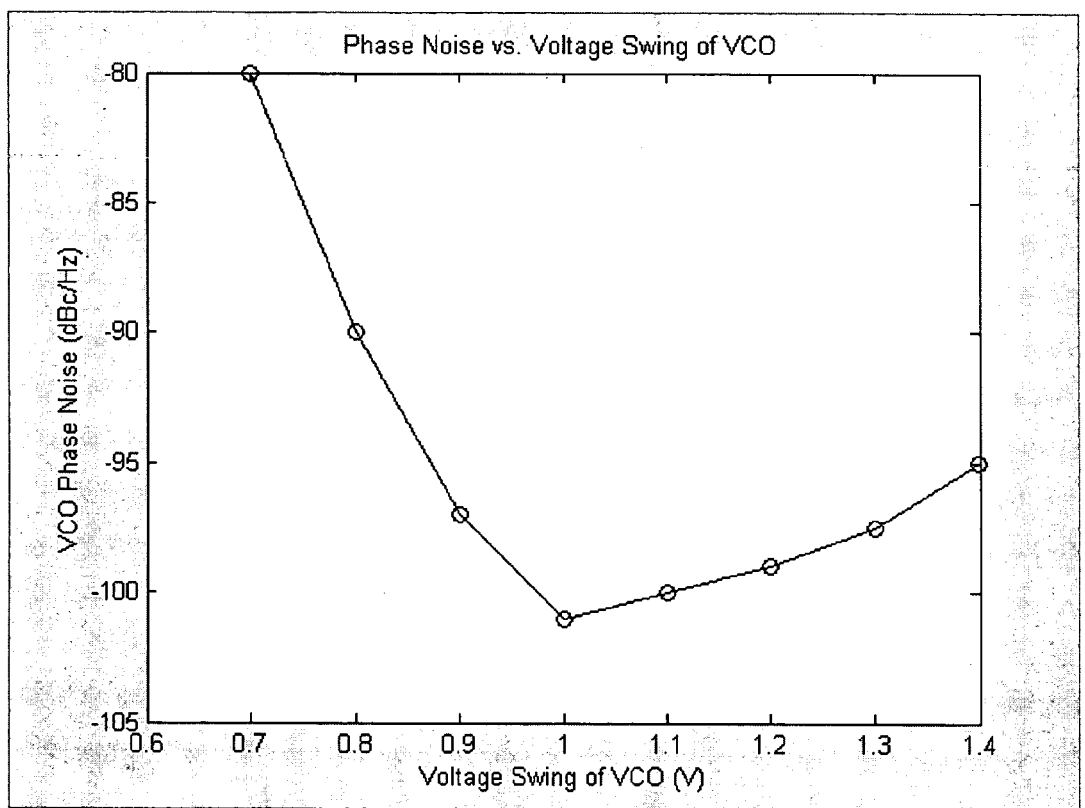
FIG. 2 shows VCO Phase Noise versus VCO Voltage Swing.

It is well known in the wireless communications art that a VCO's output swing affects its phase noise performance. FIG. 2 shows a chart 220 that provides one example of VCO phase noise versus VCO output swing. As shown in FIG. 2, when the voltage swing of the VCO increases from 0.7 V to 1 V, the phase noise performance of the VCO circuit becomes better (smaller) until the internal devices of the VCO circuit are saturated. This is due to the fact that the desired signal power becomes larger compared with the generated noise power of the VCO internal devices with the increase of the VCO output swing. To further increase the VCO voltage swing, more current is needed because the saturated transistors inside the VCO circuit clip the output swing and limit the advance augment. The additional current results in increased VCO phase noise. In particular, the generated noise power from the internal devices of the VCO increases with increase in VCO bias current. Thus, the signal to noise ratio (SNR) of the VCO circuit becomes smaller and the phase noise performance becomes accordingly worse, as shown in FIG. 2 when the voltage swing of the VCO increases from 1 to 1.4 volts.

To improve VCO phase noise performance, it is customary to bias the VCO circuit at the optimization point (e.g., at the voltage swing of 1 volt in FIG. 2). However, it is hard to maintain that optimized bias condition due to process variation, changing temperature and different working environment.s Thus, most of VCO circuits are biased at the optimization point only in some typical working environment, and they cannot guarantee the best performance of the VCO circuit in different cases (e.g., different working environments), which causes yield problems during manufacturing when a system has a tight phase noise specification.

Figure 3:
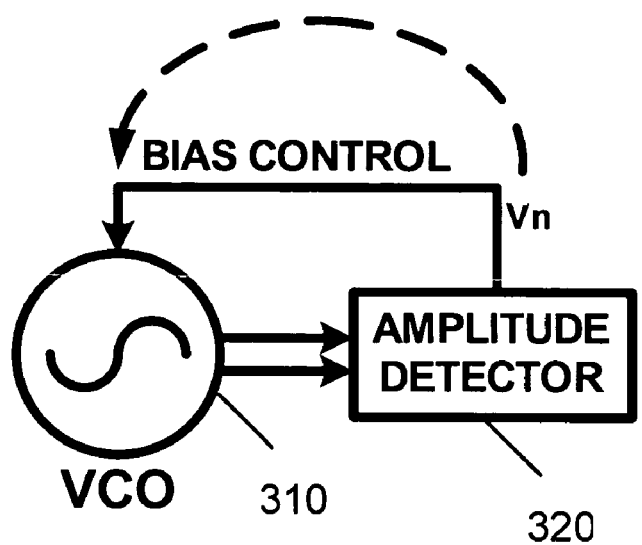
FIG. 3 shows VCO Output Swing Amplitude Control.

An amplitude control loop can be utilized to bias the VCO circuit in order to obtain the optimized output swing, as shown in FIG. 3. An amplitude value of the VCO 310 is detected by an amplitude detector circuit 320 (shown as detecting differential outputs of the VCO 310), whereby a bias control signal Vn is provided to the VCO 310 based on the detected amplitude value (to thereby close the amplitude control loop). Such an amplitude control loop is done in the analog domain.

Figure 4:
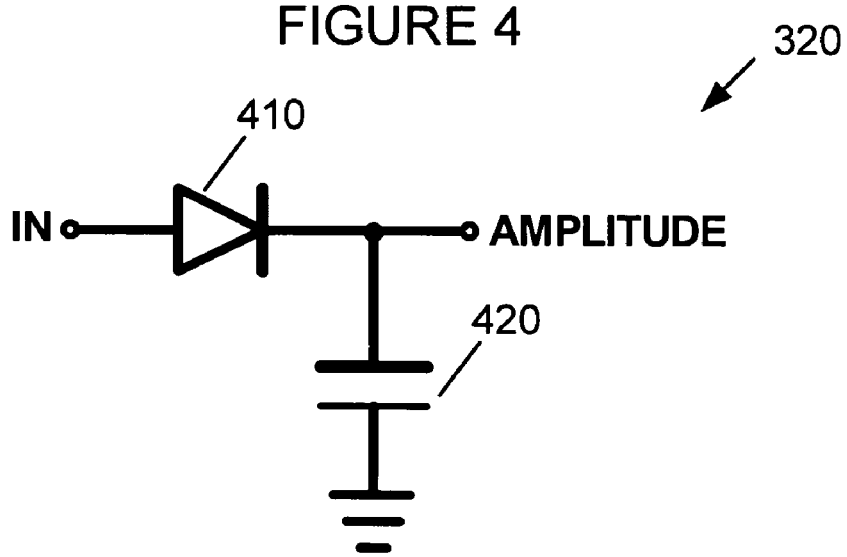
FIG. 4 shows an Amplitude Detector Circuit.

One possible amplitude detector circuit 320 is shown in FIG. 4, whereby it includes a diode 410 and a capacitor 420. The amplitude detector circuit 320 performs peak detection to evaluate the output swing of the VCO 310. Again, as mentioned above, VCO bias control using conventional methods is done through amplitude detection in the analog domain. The inventors of this application have determined that such conventional methods (such as the one shown in FIG. 3) introduce extra noise into the VCO circuit and degrade the phase noise performance.

Figure 5:
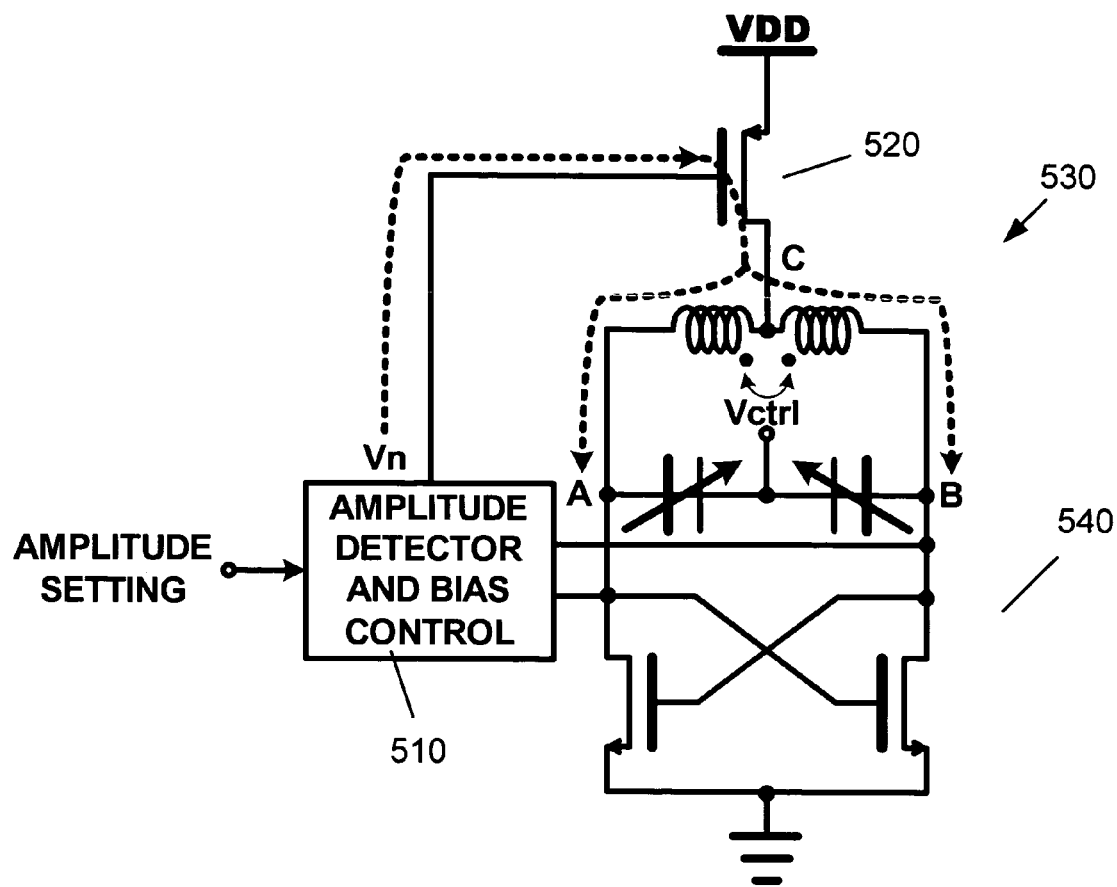
FIG. 5 shows Noise Transfer in an Analog Amplitude Control VCO.
Figure 6:
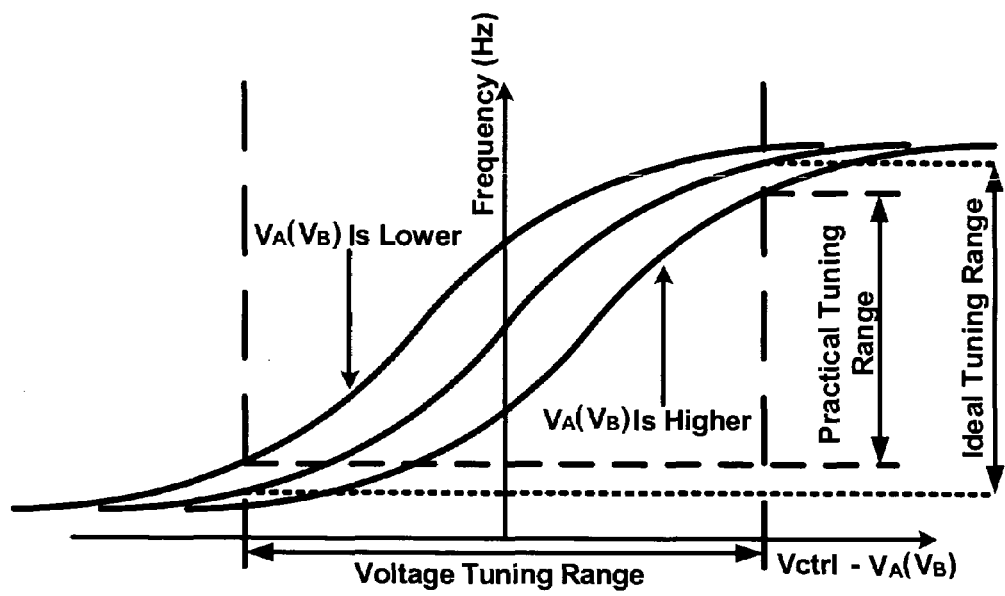
FIG. 6 shows VCO Tuning Range affected by voltage fluctuation of VCO internal nodes.

FIG. 5 shows one example of noise transfer in a VCO circuit if an analog amplitude control is utilized. The generated noise from the amplitude detector and bias control circuit 510 is amplified by a PMOS bias transistor 520 of the VCO 530, and injected into the VCO tank 540, which is then modulated into phase noise through AM-PM (amplitude modulation to phase modulation) translation. Furthermore, this scheme introduces extra capacitance load to decrease the VCO tuning range. Also, because the voltage of the internal nodes A and B shown in FIG. 5 cannot be controlled accurately through the amplitude control loop because of the limited accuracy of the amplitude detector 510, the VCO tuning characteristic versus the control voltage varies with the DC voltage of points A and B as shown in FIG. 6, which is equivalent to decreasing the VCO tuning range. Since the above amplitude control scheme in a VCO circuit is implemented in an analog circuit, it has to always be enabled and thereby it has a large power consumption.

In a first embodiment of the present invention, the VCO output swing is controlled through regulating the bias voltage at node C as shown in FIG. 5 to a fixed voltage digitally, which is equivalent to set a fixed VCO output swing. Once the optimum bias voltage requirement is determined, the bias control loop is disabled and the control setting is stored in register files (not shown, but may be a part of the VCO or part of a bias control circuit) to maintain the VCO optimum working condition. By using a digital bias control scheme in a VCO circuit, the following advantages accrue: 1) no extra introduced phase noise compared with an analog method, 2) no extra power consumption during normal operation, 3) no capacitance load introduced that will decrease the VCO tuning range, and 4) no variation in VCO tuning characteristics.

Figure 8A:
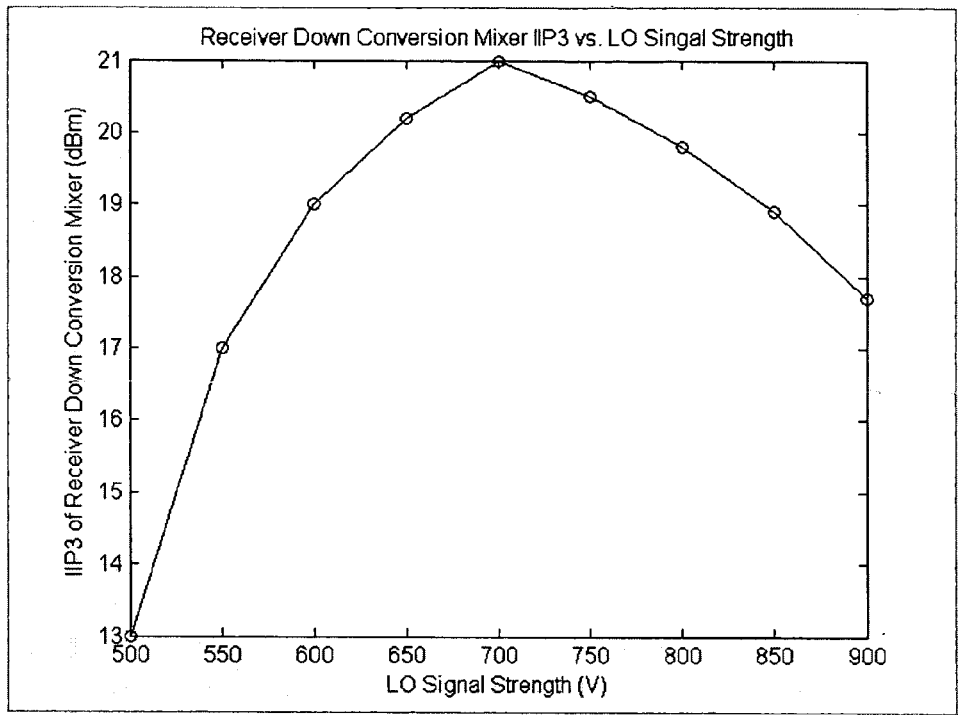
FIGS. 8A and 8B show Mixer Linearity versus Injected LO Signal Strength for an RF receiver and an RF transmitter, respectively.

An LO signal provided to one or more mixers in an RF receiver or RF transmitter is generated by a frequency synthesizer loop as: 1) a buffered signal from a VCO output in direct synthesizer architecture as shown in the circuit 710 of FIG. 7A, 2) a buffered super-harmonic or sub-harmonic of a VCO output signal in a harmonic type synthesizer architecture as shown in the circuit 720 of FIG. 7B, or 3) a buffered mixing output of different harmonics of a VCO output in offset synthesizer architecture as shown in the circuit 730 of FIG. 7C. The output LO swing is determined by the LO buffer circuit 750 in each case. According to at least one embodiment of the present invention, a digital amplitude control scheme is applied to control the LO signal strength inside the LO buffer. This is because the LO swing affects the linearity of a down-conversion mixer in an RF receiver and an up-conversion mixer in an RF transmitter. For example, based on experiments performed by the inventors of this application, the third order intermodulation product IIP3 of a down-conversion mixer is improved from 13 dBm to 21 dBm with the LO signal swing increase from 500 mV to 700 mV, as shown in FIG. 8A. However, the third order intermodulation product IIP3 becomes worse with a further increase of the LO signal strength.

Figure 8B:
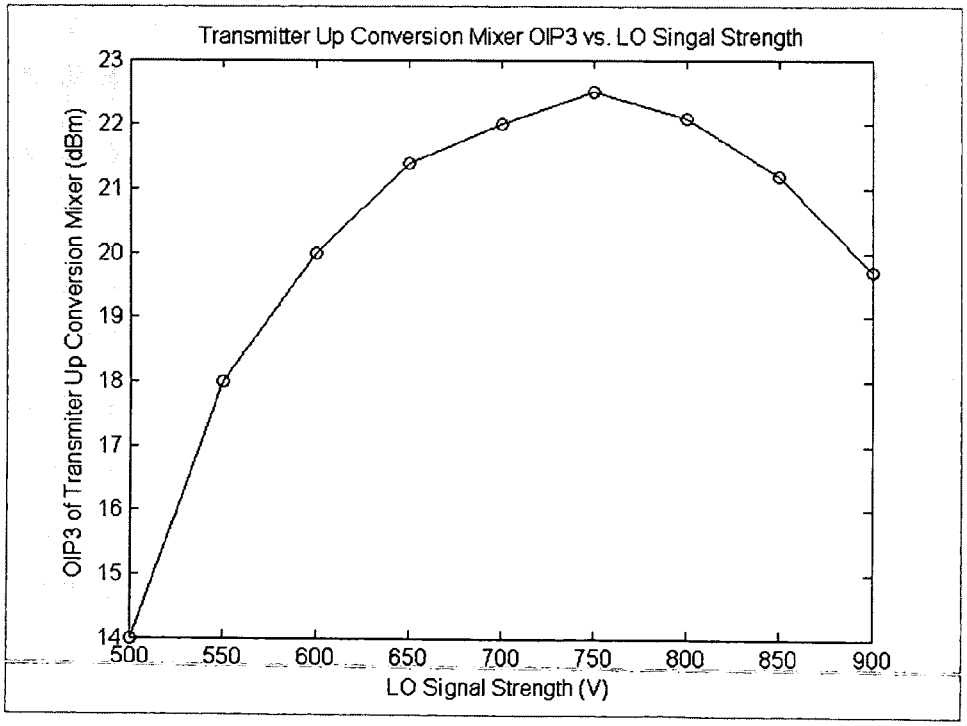

FIG. 8B shows one example of a relation between an up-conversion mixer's third order intermodulation products OIP3 and the driven LO signal strength, which holds a similar relation as that shown in FIG. 8A for the down-conversion mixer. Without a signal control scheme, the LO signal strength could increase or decrease 20% away from the desired value because of process variations. Thus, it is generally adopted to overdrive the LO buffers in order to maximize the linearity of the mixer because of the asymmetrical characteristics between the mixer linearity and the LO signal strength, as shown in FIGS. 8A and 8B. However, the mixer linearity still cannot be optimized with the signal strength variation, and there is extra power consumption if the LO signal strength is stronger than the desired signal strength. By using a digital amplitude control scheme for LO signals according to at least one embodiment of the invention, the mixers have an optimum LO signal which is free of process variation. The digital amplitude control scheme requires less power consumption than conventional analog amplitude control schemes which hurt the noise performance of the LO signal in the transmitter and the receiver. Also, it is possible to design a low power LO buffer if a digital amplitude control scheme according to at least one embodiment of the invention is utilized.

Figure 9:
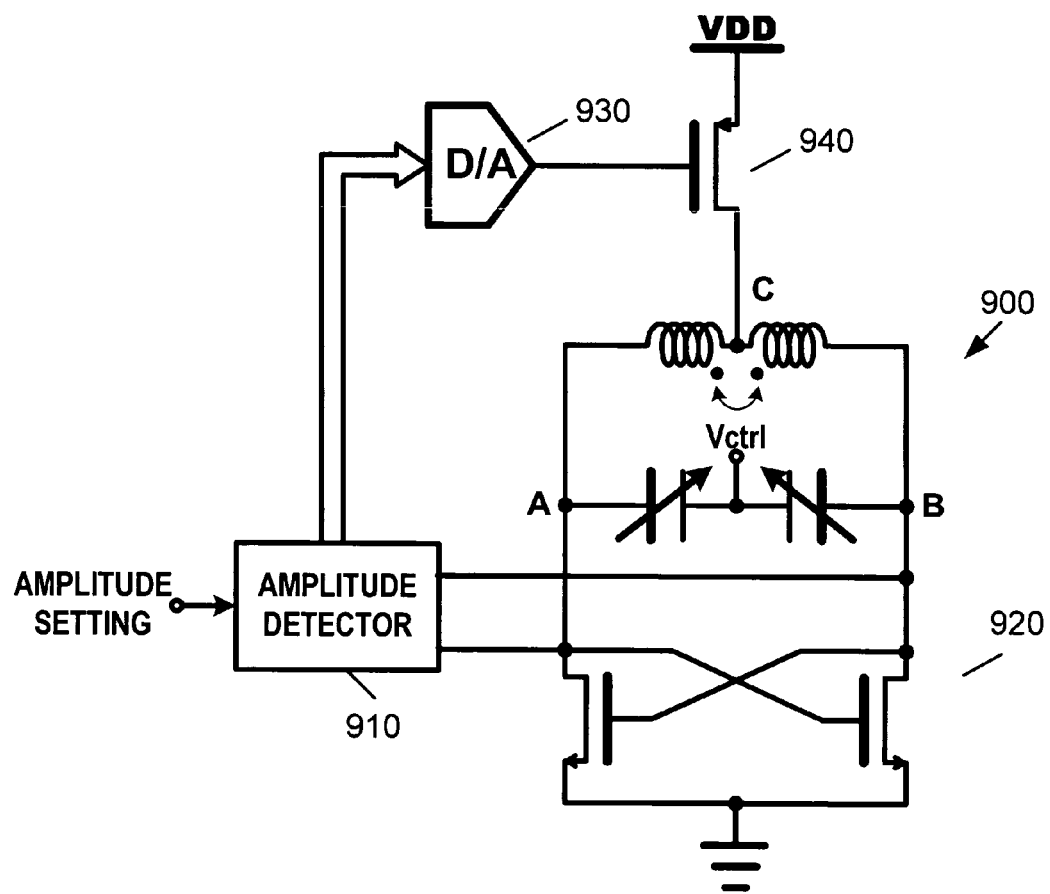
FIG. 9 shows digital VCO Output Swing Control using an Amplitude Detector, according to at least one embodiment of the invention.

A first embodiment of the present invention will be described in detail with respect to FIG. 9. A bias current of the VCO core determines the output swing of the VCO circuit if an LC tank is fixed in the VCO core. To improve the amplitude regulation of the VCO output strength, a digital control system is utilized as shown in FIG. 9 in order to avoid the introduction of noise from the amplitude detector 910 to the VCO tank 920 of the VCO 900, whereby power consumption of the amplitude detection circuit 910 is less than that required for conventional systems and methods, since it can be shut off after calibration has been performed.

In more detail, for conventional amplitude control methods and system using analog techniques, the amplitude detector stays on indefinitely, since there are an infinite number of analog states in which the system attempts to optimize to. In the amplitude control method and system using a digital loop, there is only a finite number of digital states, and once the control loop finds the optimum state, information according to that state (e.g., a binary value corresponding to the optimum state) is stored in a memory, and the digital control loop can then be shut off (to thereby save on power consumption).

The bias current and equivalent VCO tank impedance determine the VCO output swing, which can also be used to compute the bias voltage of each node (e.g., nodes A, B and C) inside the VCO 900. In the system shown in FIG. 9, the DC voltage at nodes A, B and C can also determine the VCO output swing. If the DC voltage of those nodes is higher, the swing is larger, and vice versa. This is because the DC voltage at nodes A, B and C is increased with the bias current and saturates with a further increase in bias current, whereby the VCO swing holds the same relation to the bias current.

In more detail, the amplitudes at nodes A and B of the VCO 900 are received by an Amplitude Detector 910, and compared to a predetermined Amplitude Setting. Based on that comparison, an optimized digital signal is output from the Amplitude Detector 910, and converted to an analog signal by a D/A converter 930. The analog signal is then provided as a bias voltage value to a gate of a bias transistor 940. In FIG. 9, the differential outputs A, B of the VCO 900 correspond to a position between the bias transistor 940 and the VCO tank 920 of the VCO 900.

Figure 10:
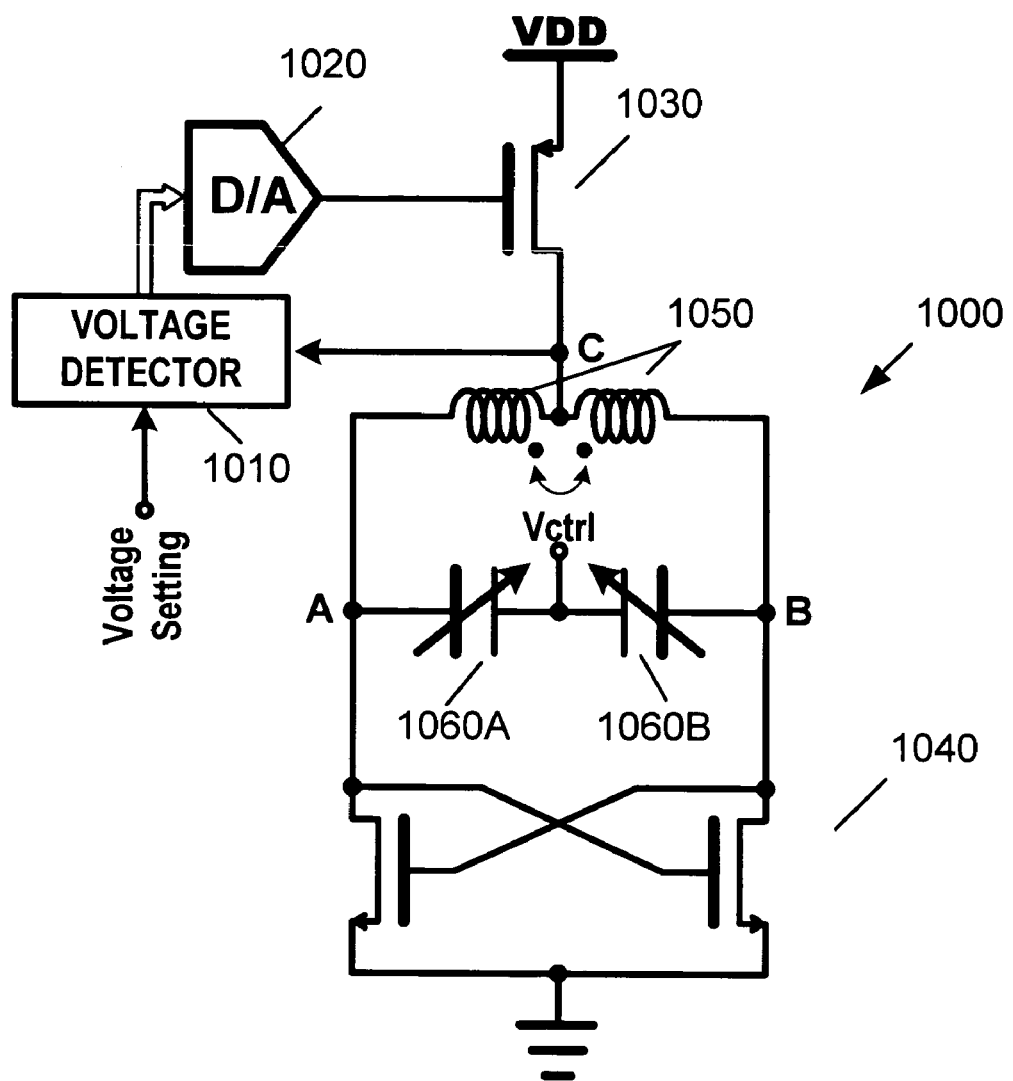
FIG. 10 shows VCO Output Swing Control through a Digital Bias Voltage Control Scheme, according to at least one embodiment of the invention.

The VCO output swing can also be controlled in the manner as shown in FIG. 10, according to a second embodiment of the invention. The DC voltage at the node C is digitally controlled to a preset voltage by a large loop gain that provides for an optimum VCO output swing. In more detail, the voltage output at node C of the VCO 1000 is received by a Voltage Comparator 1010, and compared to a predetermined Voltage Setting. Based on that comparison, an optimized digital signal is output from the Voltage Detector 1010, and converted to an analog signal by a D/A converter 1020. The analog signal is then provided as a bias voltage value to a gate of a bias transistor 1030. In FIG. 10, the differential outputs A, B of the VCO 1000 correspond to a position between the bias transistor 1030 and the VCO tank 1040 of the VCO 1000. Also shown as components of the VCO 1000 are an inductor (L) 1050 and capacitors (C) 1060A, 1060B that together correspond to an LC circuit, whereby an input voltage control signal $V_{ctrl}$ is provided at a point between the capacitors 1060A, 1060B, to thereby provide the 'voltage control' of the VCO 1000.

Figure 11:
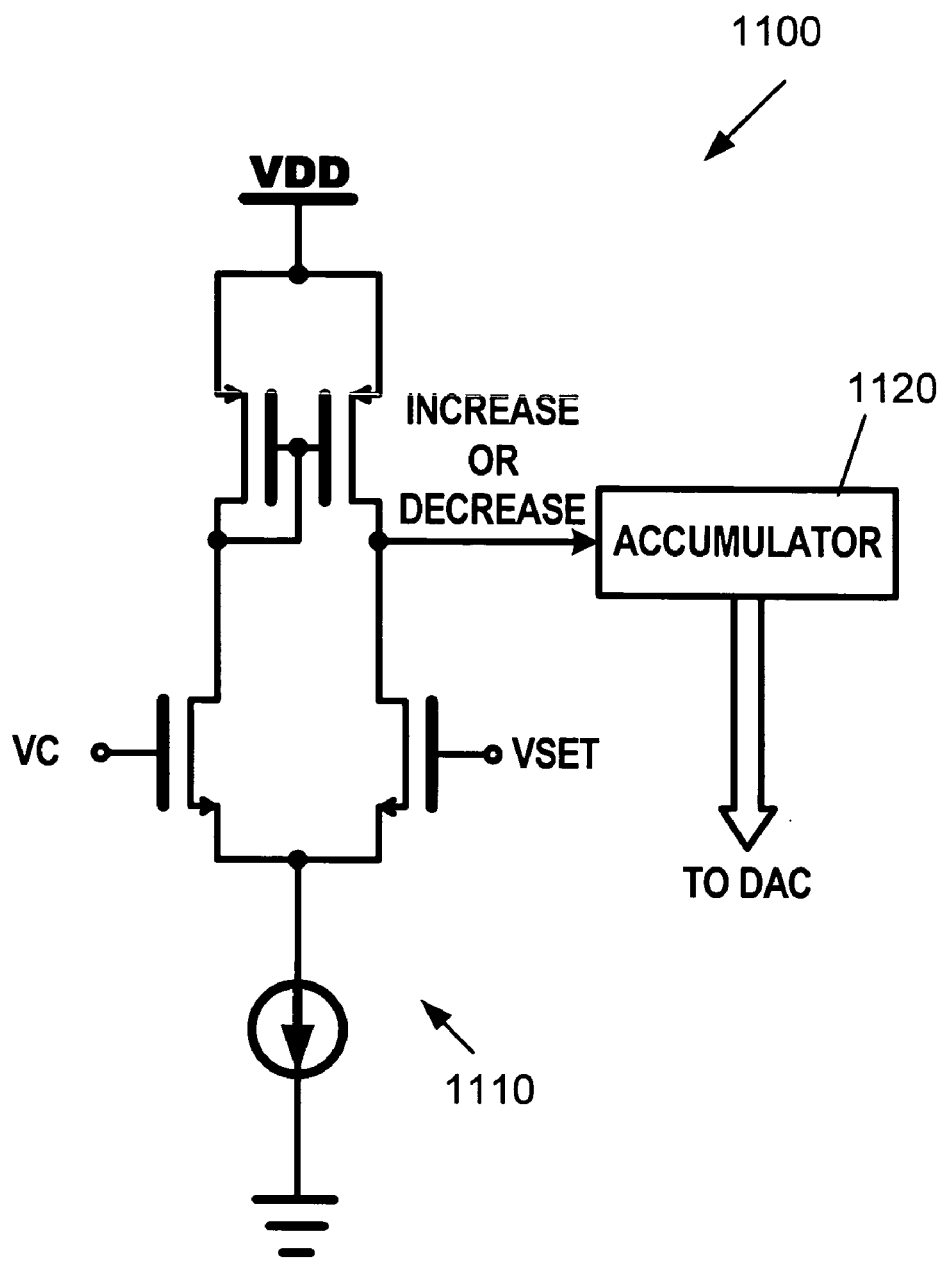
FIG. 11 shows a Voltage Comparator and Accumulator to perform VCO Amplitude Control, according to at least one embodiment of the invention.

FIG. 11 shows a closed loop digital control system 1100 according to a third embodiment of the invention, which performs voltage control (as is done in the second embodiment) instead of amplitude control (as is done in the first embodiment). The closed loop digital control system 1100 includes a comparator 1110 that determines whether the voltage at node C (Vc) is higher or lower than a preset voltage level Vset, whereby the higher or lower value results in a decrease or increase in a bias value (to be provided to a bias transistor of a VCO), by way of accumulator 1120 accumulating the higher or lower value with previous values provided to the accumulator 1120. For example, a 'higher' value may correspond to a digital "1" value, and a 'lower' value may correspond to a digital "0" or "−1" value, whereby the accumulator 1120 changes its stored accumulated value accordingly. The accumulated value (digital) of the accumulator 1120 is converted to an analog value by a D/A converter (not shown), whereby that analog value is provided as an updated bias voltage value to a bias transistor of a VCO.

Because the DC voltage at the node C (see FIG. 10, for example) is equal to that at nodes A and B, the VCO tuning characteristics can be predicted accurately in the system and method according to the third embodiment even when process variations occur. Once the bias voltage requirement at node C is met (when the voltage at node C is equal to the 'Voltage Setting' input value), the peripheral circuits (the comparator 1110, the accumulator 1120 and the D/A converter) can be turned off in order to save power during normal operation (since the digital control system and method is now "locked in" at the optimum operating point of the VCO). By way of example and not by way of limitation, when the value in the accumulator 1120 remains the same for at least a plurality of update cycles (e.g., at least four update cycles), a control circuit (not shown) turns off the peripheral circuits, since the system has been calibrated to the optimum operating point of the VCO.

Figure 12:
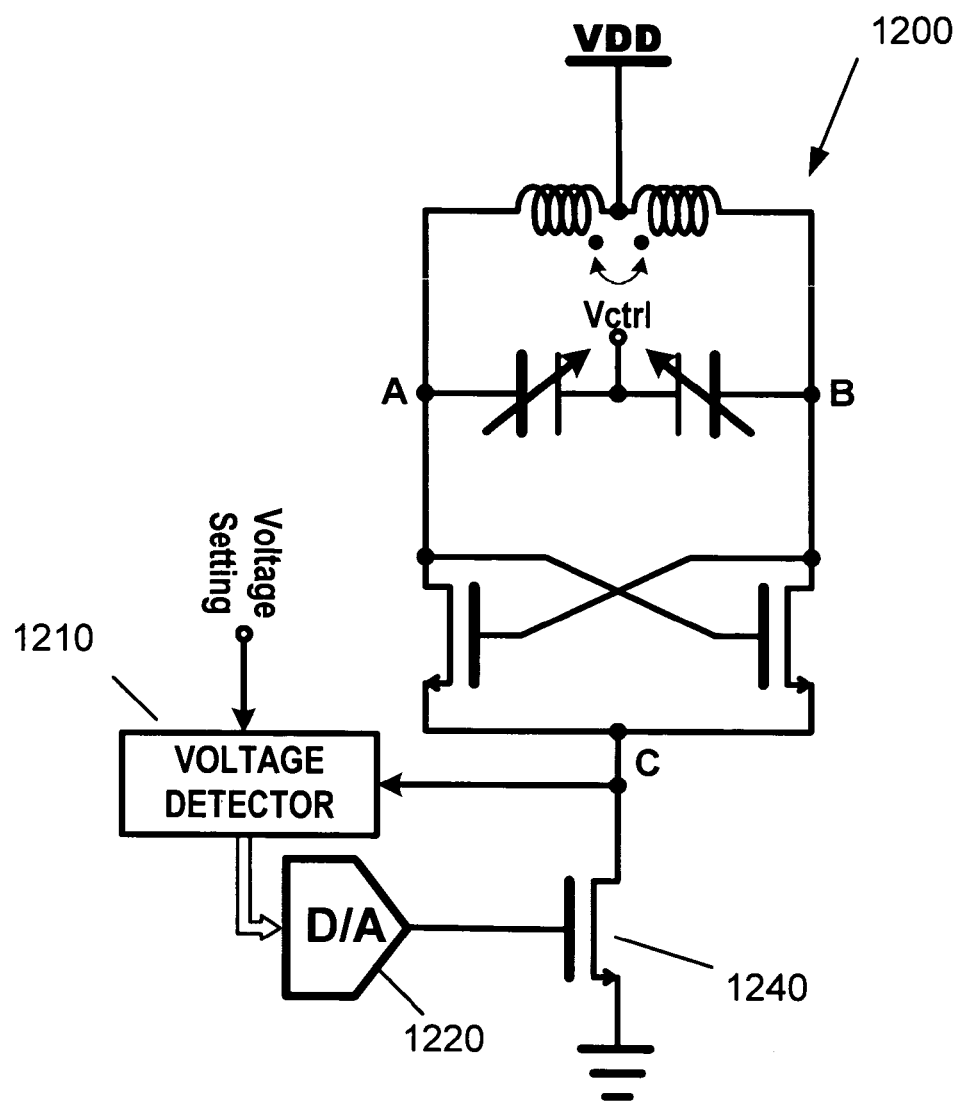
FIG. 12 shows VCO Output Swing Control through Digital Bias Voltage Control in an NMOS Type VCO, according to at least one embodiment of the invention.

The same scheme as described above can be used in other VCO architectures having different technologies, such as PMOS, NMOS, CMOS and Bipolar VCO in CMOS, BiCMOS and Bipolar technology. FIG. 12 shows the example of an NMOS type VCO 1200 with a digital amplitude control scheme, according to a fourth embodiment of the invention. In FIG. 12, a digital control loop includes a voltage detector 1210 and a D/A converter 1220, whereby a voltage comparator (not shown) inside voltage detector 1210 compares the voltage at node C with a predetermined voltage setting to determine whether the voltage at node C is higher or lower than this predetermined voltage, whereby the higher or lower value results in a decrease or increase of the bias voltage by way of an accumulator (not shown) inside voltage detector 1210 accumulating the higher or lower value with previous values provided to the accumulator, and whereby the digital output of the detector 1210 is converted to an analog bias current value by the D/A converter 1220, and provided to a gate of a bias transistor 1240 of the VCO 1200.

Figure 13:
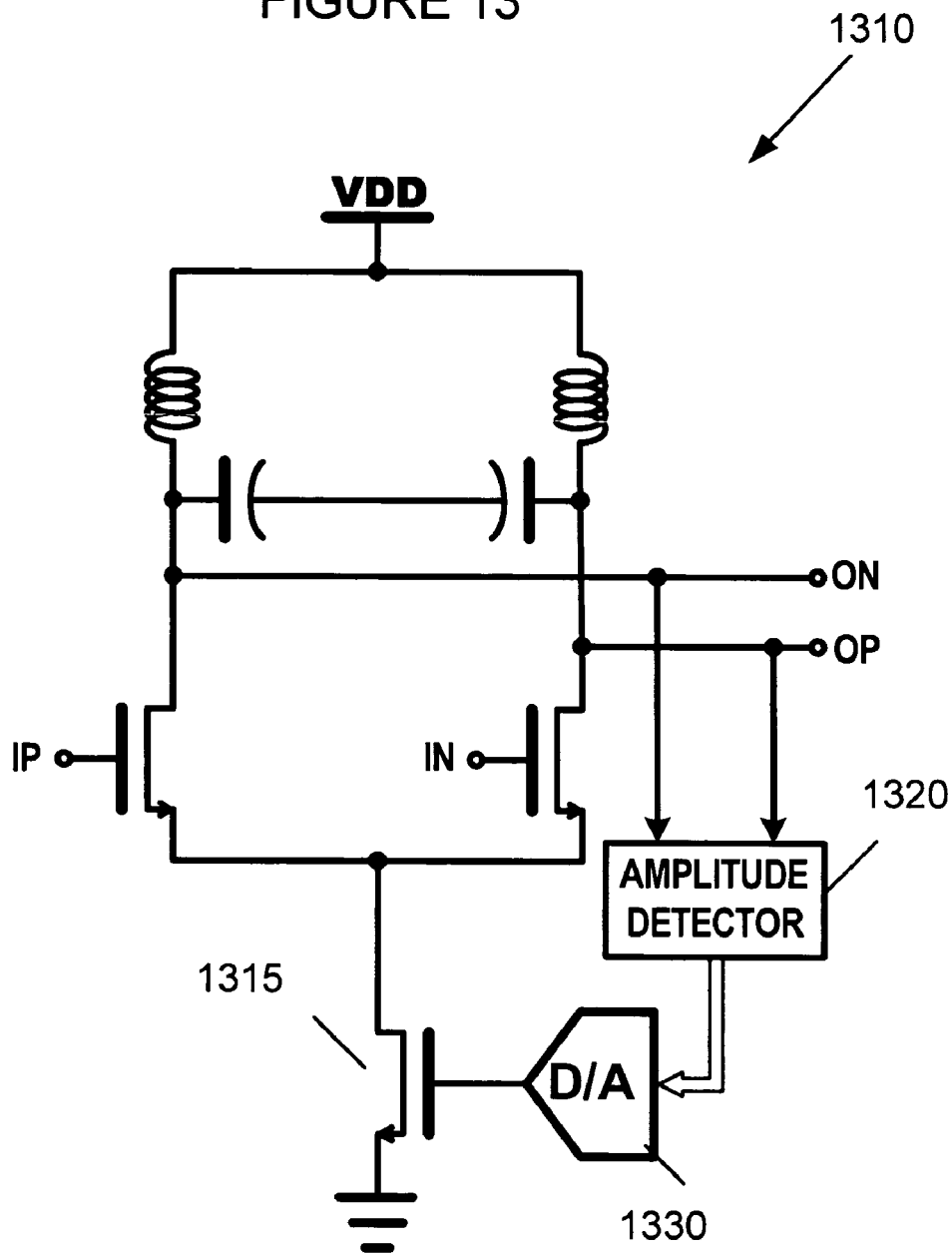
FIG. 13 shows an LO Buffer with an Amplitude Control Circuit, according to at least one embodiment of the invention.

An amplitude control system and method according to the present invention can also applied to a LO buffer in order to regulate the LO signal strength. FIG. 13 shows the an LO buffer circuit 1310 which is controlled by a digital amplitude control scheme, according to a fifth embodiment of the invention. An amplitude detector 1320 compares the LO signal strength (differential outputs of the LO buffer circuit 1310) with a preferred LO swing. Based on a comparison of the LO signal strength with the preferred LO signal strength values, a D/A converter 1330 provides an analog signal that results in either an increase or decrease of the bias value (either voltage or current) applied to a bias transistor 1315 of the LO buffer circuit 1310, which changes the LO signal strength of the LO buffer circuit 1310 accordingly.

Figure 14:
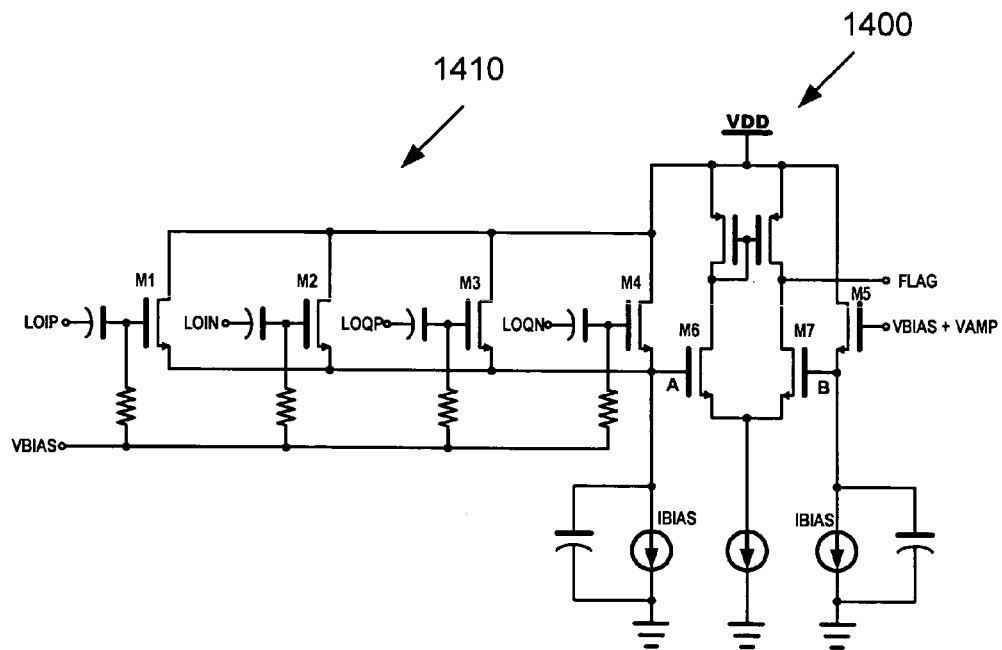
FIG. 14 shows an NMOS Quadrature LO Amplitude Detector Circuit with NMOS Comparator, according to at least one embodiment of the invention.

FIG. 14 shows an NMOS quadrature LO amplitude detector circuit 1400 with an NMOS comparator 1410, according to a sixth embodiment of the invention. The (channel width versus channel length) $W_{1,2,3,4}/L$ of transistors M1, M2, M3 and M4 is preferably one quarter the $W_5/L$ of transistor M5, and the input quadrature LO signals LOIP, LOIN, LOQP, LOQN are biased at DC voltage $V_{BIAS}$. When the LO signal swing is zero, the voltage at node A equals to the value of $V_{BIAS}$ minus the threshold voltage and overdrive voltage ($V_{GS}-V_{TH}$) of NMOS M1, M2, M3 and M4, which can be expressed as:

$$V_A = V_{BIAS} - V_{THM1,M2,M3,M4} - V_{OverDrive} =$$

$$V_{BIAS} - V_{THM1,M2,M3,M4} - \sqrt{\frac{2I_{BIAS}L}{W_5 C_{OX}\mu}},$$

where $I_{BIAS}$ is the tail bias current, $W_5/4$ is the channel width of M1, M2, M3, M4, L is the channel length, $C_{OX}$ is the gate unit capacitance of NMOS and $\mu$ is the electron mobility of M1, M2, M3 and M4.

When the LO signal swing is $V_{LO}$, the voltage at node A is changed into $$V_A = V_{BIAS} - V_{THM1,M2,M3,M4} - \sqrt{\frac{2I_{BIAS}L}{W_5 C_{OX}\mu}} + \alpha V_{LO},$$

where α is the conversion coefficient from high frequency swing to the DC voltage drop that approximately equals to 0.9 when there is a quadrature LO input and 0.7 when the LO signal input is differential.

Figure 15:
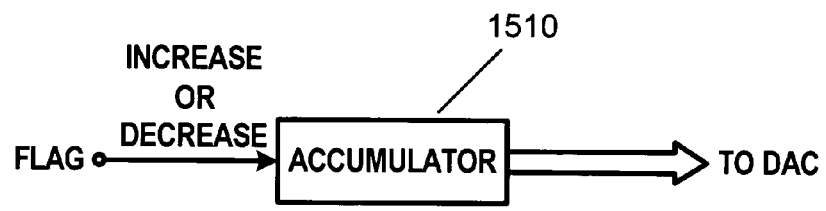
FIG. 15 shows a Digital Control Circuit with an LO Signal Strength Control Loop, according to at least one embodiment of the invention.

The NMOS comparator as shown in FIG. 14 compares the voltage level of node A and B, then supplies the result to a digital loop control circuit to increase or decrease the bias current of LO buffers, as shown in FIG. 15. In particular, the value FLAG corresponds to a signal indicating whether an increase (e.g., increase by one bit) or a decrease (e.g., decrease by one bit) to an accumulated value stored in an accumulator 1510 is to be performed, or whether the accumulated value should not change. The updated accumulated value is converted to an analog value by a D/A converter (not shown) and then is provided as an updated gate voltage to the bias transistor M5, whereby the updated gate voltage corresponds to Vbias+Vamp (where Vamp is preferably equal to the preferred LO amplitude multiplied by a constant, such as 0.7). The required LO signal amplitude can be preset through the addition of the amplitude voltage VAMP to the bias voltage $V_{BIAS}$, as a gate voltage provided to bias transistor M5, as shown in FIG. 14. Once the LO signal strength is higher than the requirement, the output FLAG is set to a logic high value (e.g., "1"), otherwise the output FLAG is kept at a logic low value (e.g., "0").

Figure 16:
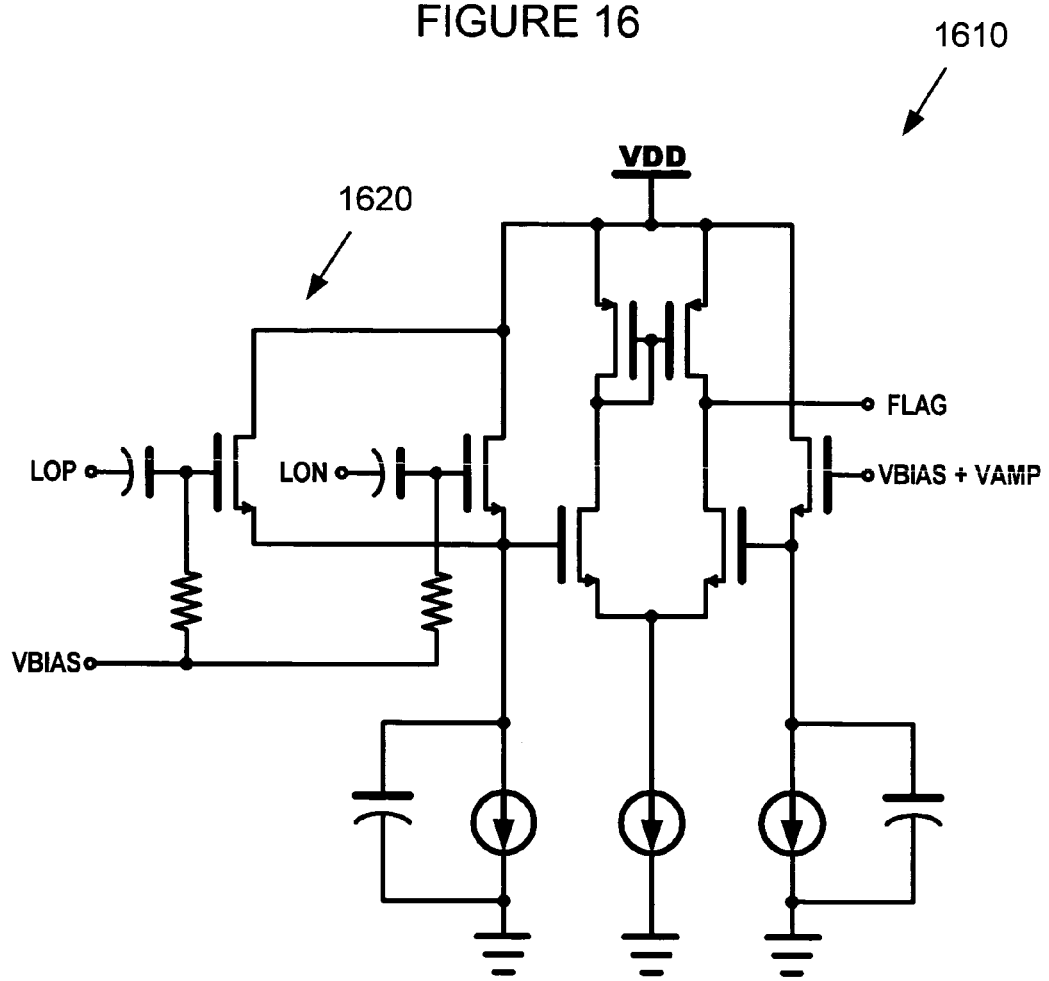
FIG. 16 shows an NMOS Differential LO Amplitude Detector Circuit with an NMOS Comparator, according to at least one embodiment of the invention.

FIG. 16 shows an NMOS differential LO amplitude detector circuit 1610 with an NMOS comparator 1620 according to a seventh embodiment of the invention, where the amplitude voltage $V_{AMP}$ is preferably equal to the preferred LO amplitude multiplied by a constant, such as 0.7. In FIG. 16, the NMOS comparator 1620 compares a voltage bias valve Vbias with differential LO values LOP (positive differential LO value) and LON (negative differential LO value), and the result of those comparisons is provided to the amplitude detector circuit 1610, in order to provide a FLAG value that corresponds to a digital signal indicating whether or not the current bias voltage value Vbias should be increased or decreased (or not changed).

Figure 17:
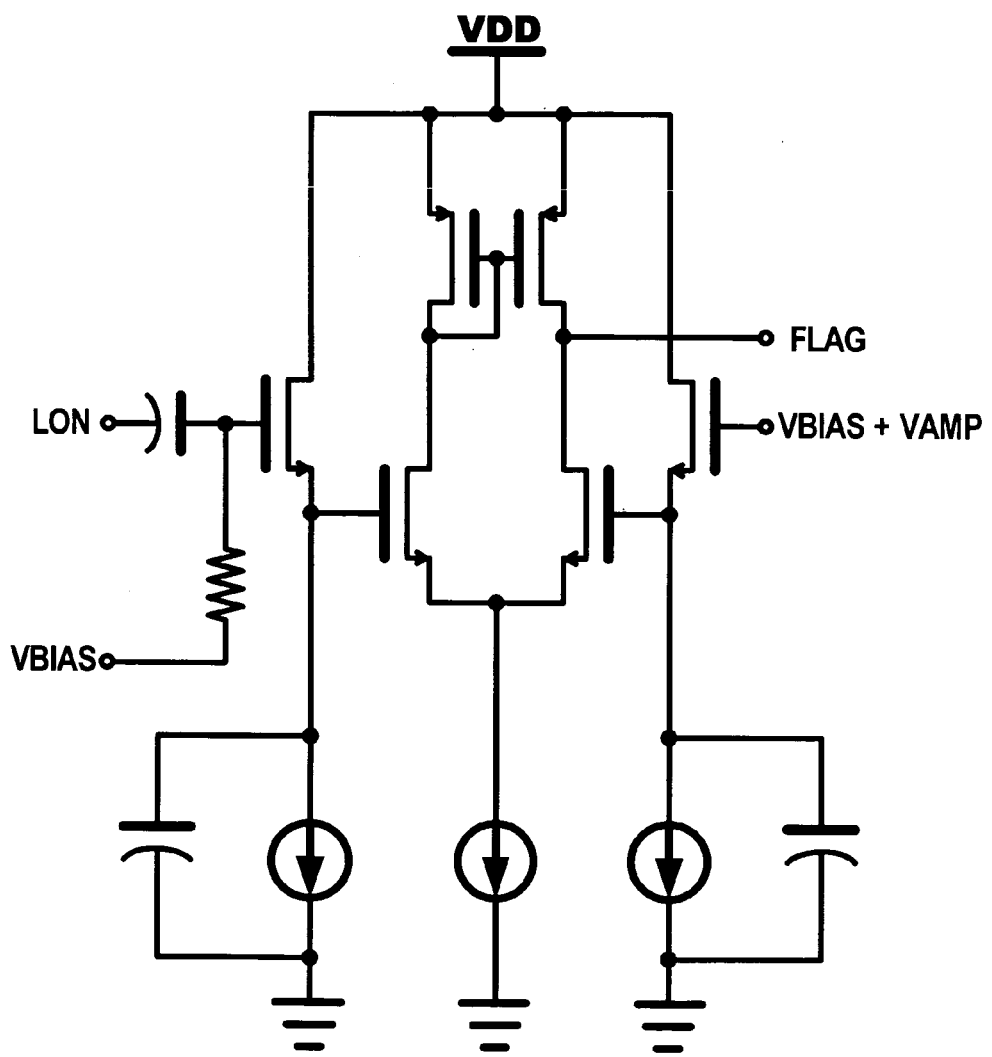
FIG. 17 shows an NMOS Single LO Amplitude Detector Circuit with NMOS Comparator, according to at least one embodiment of the invention.

FIG. 17 shows a 'single LO' amplitude detector circuit 1700 that is controlled by way of a digital amplitude control loop, according to an eighth embodiment of the invention. In FIG. 17, the single LO value is compared with a bias voltage value Vbias, and a FLAG value is output based on whether the signal LO value is either greater or less than the bias voltage value Vbias. An accumulator (not shown) accumulates the digital value corresponding to FLAG, and that value is converted to an analog value by a D/A converter (not shown), to thereby provide an updated bias voltage value Vbias.

Figure 18:
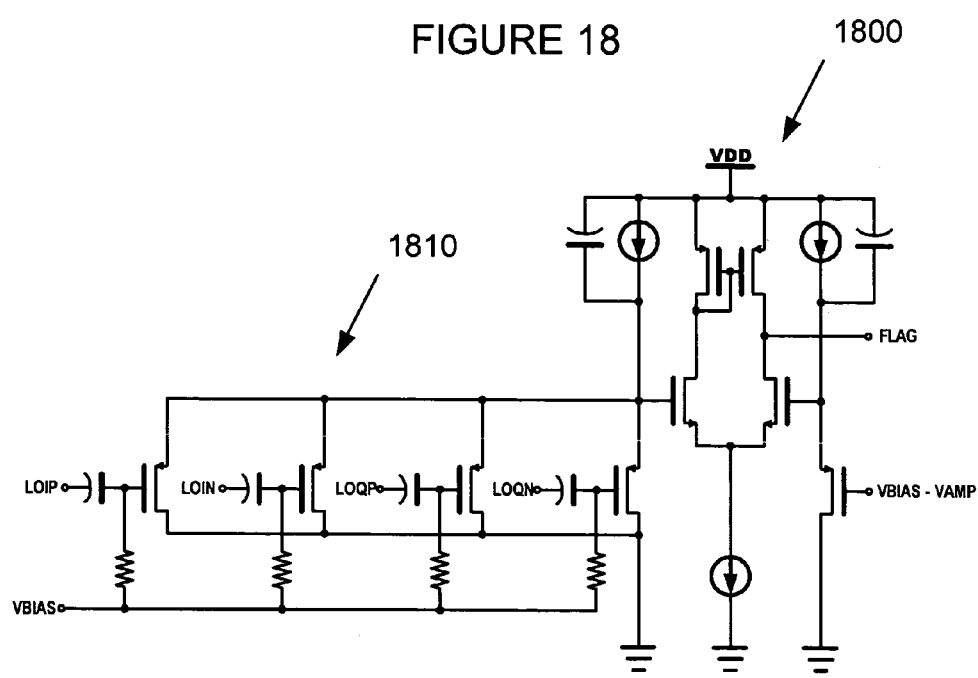
FIG. 18 shows a PMOS Quadrature LO Amplitude Detector Circuit with an NMOS Comparator, according to at least one embodiment of the invention.
Figure 19:
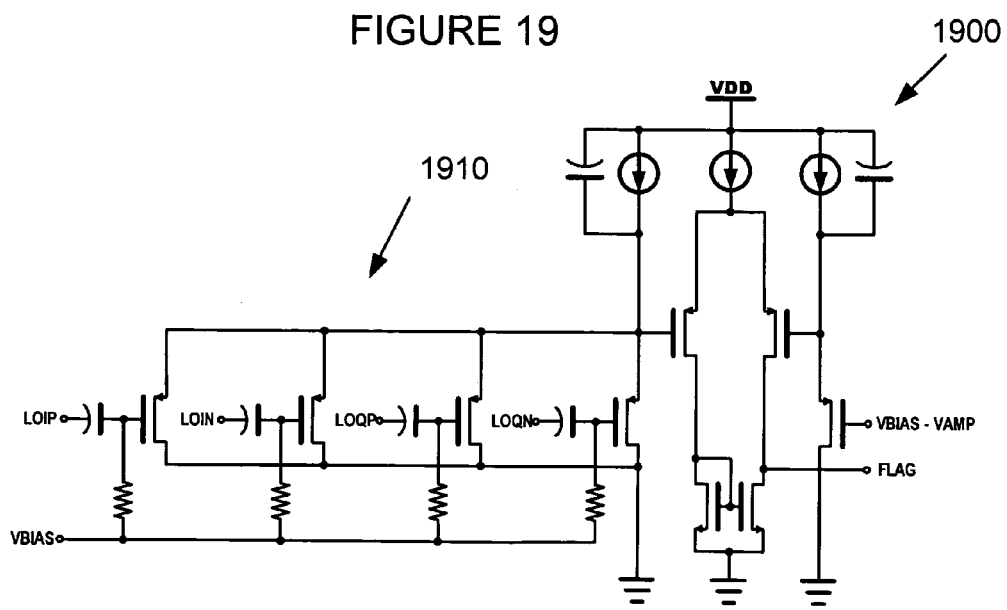
FIG. 19 shows a PMOS Quadrature LO Amplitude Detector Circuit with a PMOS Comparator, according to at least one embodiment of the invention.

The amplitude detector scheme according to the various embodiments of the invention can be used in PMOS technology or Bipolar technology, whereby FIGS. 18 and 19 show the PMOS implementation version. In particular, FIG. 18 shows a PMOS quadrature LO amplitude detector circuit 1800 with NMOS comparator 1810, and FIG. 19 shows a PMOS quadrature LO amplitude detector circuit 1900 with PMOS comparator 1910.

By using a digital amplitude control circuit in an LO buffer, an optimum LO signal can be obtained, whereby a savings in power consumption for the LO buffer can also be achieved. This is because the amplitude control circuit can be turned off during normal operation to save power because of the use of a digital implementation scheme instead of an analog implementation scheme.

Using amplitude control loops in a VCO and a LO signal generator to optimize the phase noise performance of VCO and linearity of mixer in RF transmitter or RF receiver provides the following advantages:

a) The digital amplitude control scheme according to at least one embodiment regulates the output swing of VCO, which can be shut down after the calibration to save power consumption and introduce no noise into the VCO tank to deteriorate its phase noise performance.

b) At least one embodiment provides for automatic control of the VCO output swing through the VCO internal node voltage regulation, which is more accurate and which introduces no extra capacitance load to a VCO circuit to decrease its frequency tuning range. Also, because of the stable DC voltage of the internal nodes voltage inside the VCO circuit, the frequency tuning characteristics is predictable and is free of process variation during mass production.

c) The digital amplitude control scheme according to at least one embodiment regulates the LO signal strength to obtain the optimum linearity performance in the transmitter/receiver mixer, whereby the digital amplitude control loop can be shut down after the calibration is performed, in order to save on power consumption.

d) The amplitude detector architecture according to at least one embodiment measures the RF signal strength, which can be used in various technologies.

e) Through the control of the signal strength in a frequency synthesizer circuit, the best performance of an RF transmitter or RF receiver can be obtained even with process variations. Also, a low power RF transceiver can be obtained.

The foregoing description of embodiments of the invention has been presented for purposes of illustration and description. It is not intended to be exhaustive or to limit the invention to the precise form disclosed, and modifications and variations are possible in light of the above teachings or may be acquired from practice of the invention. For example, the control scheme described above can be used to improve phase noise performance for crystal-type VCOs. The embodiments were chosen and described in order to explain the principals of the invention and its practical application to enable one skilled in the art to utilize the invention in various embodiments and with various modifications as are suited to the particular use contemplated.

What is claimed is:

1. A system for controlling a voltage controlled oscillator (VCO), the VCO including a bias transistor and at least one output line, the system comprising:

an amplitude detector configured to detect an amplitude value at the at least one output line;

a comparator configured to compare the detected amplitude value with a predetermined amplitude value, and to output a first digital value when the detected amplitude value is greater than the predetermined amplitude value, and a second digital value when the detected amplitude value is less than the predetermined amplitude value;

an accumulator configured to accumulate outputs of the comparator so as to provide an accumulated digital amplitude value;

a digital-to-analog converter to convert the accumulated digital amplitude value to an accumulated analog amplitude value, wherein the analog accumulated amplitude value is provided as an updated bias control signal to the bias transistor of the VCO.

2. The system according to claim 1, wherein the at least one output line corresponds to two output lines of a differential VCO.

3. The system according to claim 1, wherein the at least one output line corresponds to four output lines of a quadrature VCO.

4. The system according to claim 1, wherein the at least one output line corresponds to one output line of a single-output VCO.

5. The system according to claim 1, wherein the VCO further includes an LC circuit provided between the bias transistor and VCO switch transistors.

6. The system according to claim 1, wherein the bias control signal corresponds to a bias voltage signal provided to a gate of the bias transistor.

7. The system according to claim 1, wherein the bias control signal corresponds to a bias voltage provided to a gate of the bias transistor.

8. The system according to claim 1, further comprising a control circuit configured to turn off the comparator, the amplitude detector, the accumulator and the digital-to-analog converter when the accumulated digital amplitude value has remained constant for at least a predetermined amount of time.

9. A system for controlling a voltage controlled oscillator (VCO), the VCO including a bias transistor, the system comprising:

a voltage detector configured to detect a voltage value at a node that is directly coupled to the bias transistor;

a comparator configured to compare the detected voltage value with a predetermined voltage value, and to output a first digital value when the detected voltage value is greater than the predetermined voltage value, and a second digital value when the detected voltage value is less than the predetermined voltage value;

an accumulator configured to accumulate outputs of the comparator so as to provide an accumulated digital voltage value;

a digital-to-analog converter to convert the accumulated digital voltage value to an accumulated analog voltage value, wherein the accumulated analog voltage value is provided as an updated bias control signal to the bias transistor of the VCO.

10. The system according to claim 9, wherein the node corresponds to a point between the bias transistor and an LC circuit of the VCO.

11. The system according to claim 9, wherein the at least one output line corresponds to two output lines of a differential VCO.

12. The system according to claim 9, further comprising a control circuit configured to turn off the comparator, the voltage detector, the accumulator and the digital-to-analog converter when the accumulated digital voltage value has remained constant for at least a predetermined amount of time.

13. A method for controlling a LO buffer, the LO buffer including a bias transistor and at least one output line, the method comprising:

detecting an amplitude value at a node corresponding to the at least one output line;

comparing the detected amplitude value with a predetermined amplitude value, and to output a first digital value when the detected amplitude value is greater than the predetermined amplitude value, and a second digital value when the detected amplitude value is less than the predetermined amplitude value;

accumulating outputs of the comparing step so as to provide an accumulated digital amplitude value; and converting the accumulated digital amplitude value to an accumulated analog amplitude value, wherein the analog accumulated amplitude value is provided as an updated bias control signal to the bias transistor of the LO buffer.

14. The method according to claim 13, wherein the node corresponds to a point between the bias transistor and a load of the LO buffer.

15. The method according to claim 13, wherein the at least one output line corresponds to two output lines of a differential LO buffer.

16. The method according to claim 13, wherein the at least one output line corresponds to four output lines of a quadrature LO buffer.

17. The method according to claim 13, wherein the at least one output line corresponds to one output line of a single-output LO buffer.

18. The method according to claim 13, further comprising:

providing the bias control signal to a gate of the bias transistor.

19. The method according to claim 13, further comprising:

monitoring the accumulated digital amplitude value to determine if it has not changed for at least a first period of time; and turning off a comparator, an amplitude detector, an accumulator and a digital-to-analog converter of a control feedback loop when the accumulated digital amplitude value has not changed for at least the first period of time.

20. A method for controlling a LO buffer, the LO buffer including a bias transistor, the method comprising:

detecting a voltage value at a node that is directly coupled to the bias transistor;

comparing the detected voltage value with a predetermined voltage value, and to output a first digital value when the detected voltage value is greater than the predetermined voltage value, and a second digital value when the detected voltage value is less than the predetermined voltage value;

accumulating outputs of the comparing step so as to provide an accumulated digital voltage value; and converting the accumulated digital voltage value to an accumulated analog voltage value, wherein the accumulated analog voltage value is provided as an updated bias control signal to the bias transistor of the LO buffer.

21. The method according to claim 20, wherein the node corresponds to a point between the bias transistor and an LC circuit of the LO buffer.

22. The method according to claim 20, wherein the at least one output line corresponds to two output lines of a differential LO buffer.

23. The method according to claim 20, further comprising:

monitoring the accumulated digital voltage value to determine if it has not changed for at least a first period of time; and turning off a comparator, a voltage detector, an accumulator and a digital-to-analog converter of a control feedback loop when the accumulated digital voltage value has not changed for at least the first period of time.

* * * * *